United States Patent [19]

Jones

[11] Patent Number: 4,998,341

[45] Date of Patent: Mar. 12, 1991

[54] METHOD FOR MAKING MINERAL INSULATED METAL SHEATHED CABLES

[75] Inventor: Trevor D. Jones, White Cross, England

[73] Assignee: Inco Alloys Limited, Hereford, England

[21] Appl. No.: 503,314

[22] Filed: Apr. 2, 1990

[30] Foreign Application Priority Data

Apr. 18, 1989 [EP] European Pat. Off. ........ 89303821-6

[51] Int. Cl.⁵ ............................................. H01B 13/20
[52] U.S. Cl. .................................. 29/828; 174/102 P; 219/544; 338/28
[58] Field of Search .................. 29/828, 825, 611, 612, 29/615, 595; 136/201, 232, 233, 242; 338/28, 238; 174/102 P, 118; 219/544; 156/52; 72/258

[56] References Cited

U.S. PATENT DOCUMENTS

| | | | |
|---|---|---|---|
| 2,123,778 | 7/1938 | Heilmann | 174/102 P |
| 2,703,335 | 3/1955 | Andrus | 136/4 |
| 3,065,286 | 11/1962 | Connell | 136/4 |
| 3,121,038 | 2/1964 | Perotte | 156/48 |
| 3,254,320 | 5/1966 | Hill et al. | 219/544 X |
| 3,266,001 | 8/1966 | Landis et al. | 338/28 X |
| 3,353,260 | 11/1967 | Davis et al. | 29/573 |
| 3,463,674 | 8/1969 | Black et al. | 136/233 |
| 4,080,726 | 3/1978 | Neimanns et al. | 29/611 |
| 4,300,038 | 11/1981 | Schwarzkopf | 219/544 |
| 4,494,307 | 1/1985 | Bourget | 29/825 |
| 4,538,350 | 9/1985 | Nosal et al. | 29/825 |
| 4,778,537 | 10/1988 | Thom et al. | 136/201 |

FOREIGN PATENT DOCUMENTS

| | | |
|---|---|---|
| 0084171 | 7/1983 | European Pat. Off. . |
| 88/291187 | 11/1988 | European Pat. Off. . |
| 481430 | 12/1916 | France . |
| 818263 | 9/1937 | France . |
| 904986 | 11/1945 | France . |
| 2503442 | 10/1982 | France . |
| 89/00464 | 1/1989 | PCT Int'l Appl. . |
| 530574 | 12/1940 | United Kingdom . |
| 601630 | 5/1948 | United Kingdom ............ 174/102 P |
| 854570 | 1/1960 | United Kingdom ................ 136/233 |
| 1195630 | 6/1970 | United Kingdom . |
| 477917 | 1/1978 | United Kingdom ............ 174/102 P |
| 2100159 | 12/1982 | United Kingdom . |

OTHER PUBLICATIONS

Shultz et al., in "Current Trends in Seamless Tube Mill Design" Sep. 1976, pp. 47–57.

*Primary Examiner*—Carl E. Hall
*Assistant Examiner*—Carl J. Arbes
*Attorney, Agent, or Firm*—Francis J. Mulligan, Jr.; Edward A. Steen

[57] ABSTRACT

A method for making mineral insulated metal sheathed (MIMS) cable is disclosed. A tube of relatively large diameter is filled with at least one electrically conducting rod and an insulator. The resultant tubular assembly is sealed, hot rolled, reduced on a pilger (tube reducer) mill and drawn into relatively thin wire cable. The method is especially suitable for thermocouple cable production. Other applications include heating cable and control cable manufacture.

6 Claims, No Drawings

METHOD FOR MAKING MINERAL INSULATED METAL SHEATHED CABLES

TECHNICAL FIELD

The instant invention relates to mineral insulated metal sheathed (MIMS) cables in general and, more particularly, to a method for manufacturing mineral insulated metal sheathed thermocouple cable. Other similar MIMS cables, such as heating cables and control cables may also be fabricated.

BACKGROUND ART

Thermocouples, devices that convert heat energy into electrical energy, are well known. They are most commonly used for measuring temperatures where conventional thermometers or other temperature measuring instruments cannot be used.

A thermocouple utilizes the thermoelectric effect. Essentially, a thermocouple is comprised of two dissimilar metals, usually in wire form, joined together at a location called the hot junction. The other ends (leads) of the metals are usually ultimately connected to a voltage sensing device, i.e. a volt meter or potentiometer; these leads are at a known reference temperature called the cold junction The temperature differential between the hot junction and the cold junction creates a small but measurable electrical potential between the dissimilar metals. By measuring this potential, the temperature sensed by the hot junction may be ascertained.

The conductors running from the hot junction of the thermocouple are often encased in a metal sheath. The sheath includes electrical insulation generally comprised of an electrically resistive metal oxide.

Mineral insulated metal sheathed (MIMS) thermocouple elements are normally made from separately produced, initially small diameter tubing of typically 25.4 mm (1 inch) outside diameter and cold drawn element wires of about 4.0 mm (0.16 inch) diameter. A number of involved procedural steps are first required to manufacture the narrow tubing and wires to these sizes. The tube may be made from INCONEL ® alloys, NICROBELL ® alloys, austenitic stainless steels, etc., and the negative and positive wire elements may be made from CHROMEL ® alloys, ALUMEL ® alloys, NISIL ® alloys, nicrosil alloys, CONSTANTAN ® alloys, etc. MIMS thermocouple cables are available, for example, as "K", "N", "T", "J" and "E" types.

The wire elements are then inserted into the tube. An insulator, usually magnesium oxide in the form of prefused crushable beads, is introduced into the tube in part to space the wire elements, to prevent them from contacting the tube, and provide some mechanical integrity to the thermocouple cable. The beads include holes to accommodate the wire elements The entire assembly is then swaged, rolled or cold drawn to the required final small diameter—usually on the order of about 3.0 mm to 6.0 mm (0.12–0.24 inches).

The aforementioned method is intrinsically expensive; it requires numerous preparatory steps; and is time consuming.

Representative prior art techniques, predominantly employing swaging, may be found in U.S. Pat. Nos. 2,703,335; 3,065,286; 3,121,038; 3,353,260; 3,463,674; and 4,778,537.

SUMMARY OF THE INVENTION

Accordingly, there is provided a more efficient, less costly method for producing MIMS cable. Relatively large diametered tubes are initially employed After packing them with element rods (themselves relatively large diametered) and an insulator, the assembly is sealed, hot rolled, reduced and cold drawn. There is no need to employ costly and time consuming initial steps to produce small diametered components prior to the assembling of the MIMS cable.

PREFERRED MODE FOR CARRYING OUT THE INVENTION

The instant method consists of the initial utilization of an extruded seamless tube sheath of relatively larger diameter than the prior art methods discussed above. The initial tube diameter may be approximately 76.2–88.9 mm (3–3178 inches). This value is appreciably larger than the prior art initial tube with the attendant lower cost of manufacture.

Hot rolled or cold drawn element rods (not wire) are inserted into the tube sheath along with the appropriate insulator. Typical rod diameters may be about 15.7 mm (0.62 inches). After the ends are sealed with a plug, the entire assembly is then hot rolled to form a closed tube by conventional rolling techniques down to about 50.8 mm (2 inches) in diameter. It is necessary to employ round-to-round rod rolling passes to maintain geometry After this hot rolling step it has been demonstrated that an insulator, magnesium oxide powder, was properly consolidated to solid form.

The hot rolled assemblies are then further reduced to size suitable for conventional wire drawing. This may be expeditiously done on a conventional pilger (or tube reducing) mill modified only by the removal of the central mandrel normally employed when reducing larger diameter tubes.

Essentially, a pilger mill includes two vertically opposed, contacting arcuate roller dies mounted in a horizontally reciprocating carriage The carriage is driven through a reciprocating stroke distance Each roller die has a similar tapered groove of increasing cross sectional area formed into its curved circumferential working surface. As the carriage is reciprocated (or rocked), the dies rotate over the tube. The tapered grooves on the roller dies flatten and elongate the wall of the tube thereby stretching it and simultaneously thinning out the wall thickness. The tube is pulled through the mill in synchronization with the rocking cycle. Normally a mandrel is inserted into the center of the tube when a hollow tube is produced. However, in this instance, since the solid tube is sealed and quite small in diameter, the mandrel is removed. A pilger mill is usually operated at ambient temperature.

Using the pilger mill without the mandrel can reduce the solid cable tube down to about 12.7 mm (0.5 inches) while still maintaining the required tube geometry.

The tubes are then cold drawn by conventional techniques down to the requisite diameter typically of the order of 3.0 mm to 6.0 mm ) 0.12–0.24 inches) but sometimes as low as 0.5 mm (0.02 inches).

As an illustrative, non-limiting thermocouple example, a NICROBELL ® alloy (Ni-Cr-Si-Mg) starter tube of about 88.9 mm (3.5 7 mm (0.62 inches) diameter rods—one comprised of NISIL ® alloy (Ni-Si-Fe), the other comprised of nicrosil alloy (Ni-Cr-Si). The assembly was plugged at both ends with an INCONEL ® alloy 600 plug and placed into a Morgardshammer TM two-high rolling mill. Fourteen passes reduced the diameter of the tube, in incremental steps, to about 50.0 mm (2 inches). Rolling temperature was about 1100° C. (2012° F.)

As an expedient, two standard pilger (reducing) mills were employed at room temperature. Initial reducing from about 50.0 mm to 31.8 mm (about 2.0 inches to about 1.25 inches) was carried out on a 50.8 mm (2 inches) Roberston TM mill. The tube was further reduced down to 12.7 mm (0.5 inches) on a 50.8 mm (2 inches) Meer TM mill.

Standard wire drawing techniques were employed. The resultant tube/cable was processed essentially by single holing to avoid welding down to about 2 mm (0.08 inches). The rods/elements were proportionally reduced to about 0.38 mm (0.015 inches).

Electrical tests indicated commercially acceptable results.

What should be noted is that in the instant process, the initial internal rods which constitute the negative and positive elements of the thermocouple, are lengthened and are substantially reduced in diameter in proportion with the surrounding tubular sheath material. In other words, the final diameters of the rods are substantially smaller, preferably at least about 85% than the corresponding initial rods. In the example above the rod diameter was reduced by 97.7%.

Similarly, the final diameter of the tubular sheath is substantially smaller, also preferably at least about 85%, than the corresponding initial tube sheath. In the example above, the tubular sheath was also reduced by 97.7%. Moreover, the original loose filled magnesium oxide powder insulation is consolidated into a desirable crumble resistant solid aiding in the mechanical integrity of the resultant thermocouple cable.

It should be appreciated that the instant process may be used for a variety of combinations of thermocouple elements, insulators in any form, powder, bead, etc., and sheathing materials.

In order to manufacture thermocouples from the MIMS cable, the conductor wires in the MIMS cable are generally welded together to form the hot junction and the sheath then closed by either fusing the end of the sheath to form a seal or by insertion of an end plug which is then welded in place. This is known as an 'insulated junction'. Sometimes, however, the conductors and the sheath are welded together to form a 'bonded junction'. This is reputed to have a quicker response time than the insulated junction types.

The cold end of the cable is sealed to prevent ingress of moisture. Various sealing compounds are employed depending on the maximum temperature envisaged for the unit. Epoxy resin is typical.

The methods by which the conductor wires are attached to the extension leads are many and various. The sealed ends are usually encapsulated in a device suitable for the intended method of installation. For instance, it may be externally threaded to receive a female connector or be a simple terminal block. The physical connection of the conductor wires and the leads is generally achieved by means of screw terminals.

Moreover, although thermocouple cable applications have been discussed, it should be appreciated that the above referenced technique is applicable to cables similar in construction to MIMS thermocouple cables. Heating cables and control cables are often made in a similar manner. They too contain one or more conductor elements and insulation. Although they are ultimately destined for different service requirements, the principles of MIMS thermocouple cable construction may be applied to these cables as well.

I claim:

1. A method for producing mineral insulated metal sheathed cable, the cable including an external sheath in the form of a tube, at least one conducting member and an insulator disposed within the tube, the method characterized by:
   a. introducing at least one conducting rod and the insulator into a tubular sheath, the conducting rod and tubular sheath having diameters substantially larger than the diameter of the corresponding finished conducting member and cable;
   b. sealing the tubular sheath;
   c. hot working the sealed tubular sheath to a tube of a first predetermined diameter;
   d. reducing the tube on a pilger mill to a second predetermined diameter; and
   e. working the tube to a final predetermined cable diameter.

2. The method according to claim 1 including hot working the tubular sheath on a rolling mill to the first predetermined diameter.

3. The method according to claim 1 including working the tube by wire drawing to the final predetermined cable diameter.

4. The method according to claim 1 wherein the diameters of a conducting rod and the tubular sheath are reduced by at least about 85%.

5. The method according to claim 1 including introducing two conducting members into the sheath and joining them together at one end of the cable to form a thermocouple.

6. The method according to claim 1 including sealing at least one end of the sheath.

* * * * *